(12) United States Patent
Kimishima

(10) Patent No.: US 12,289,838 B2
(45) Date of Patent: Apr. 29, 2025

(54) WIRING SUBSTRATE AND METHOD FOR MANUFACTURING WIRING SUBSTRATE

(71) Applicant: IBIDEN CO., LTD., Gifu (JP)

(72) Inventor: Yasuki Kimishima, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 110 days.

(21) Appl. No.: 18/164,655

(22) Filed: Feb. 6, 2023

(65) Prior Publication Data
US 2023/0254979 A1    Aug. 10, 2023

(30) Foreign Application Priority Data
Feb. 7, 2022 (JP) ................................ 2022-017534

(51) Int. Cl.
| | |
|---|---|
| H05K 3/18 | (2006.01) |
| C25D 3/38 | (2006.01) |
| C25D 5/10 | (2006.01) |
| C25D 7/12 | (2006.01) |
| H05K 1/02 | (2006.01) |
| H05K 1/11 | (2006.01) |

(52) U.S. Cl.
CPC .............. *H05K 3/188* (2013.01); *C25D 3/38* (2013.01); *C25D 5/10* (2013.01); *C25D 7/123* (2013.01); *H05K 1/0298* (2013.01); *H05K 1/115* (2013.01)

(58) Field of Classification Search
CPC ...... H05K 3/188; H05K 1/0298; H05K 1/115; C25D 3/38; C25D 5/10; C25D 7/123
See application file for complete search history.

(56) References Cited

U.S. PATENT DOCUMENTS

2003/0102223 A1 *  6/2003  Shimo ................... H05K 3/423
                                                  205/104
2007/0096328 A1 *  5/2007  Takahashi ............... H05K 3/00
                                                  257/774

FOREIGN PATENT DOCUMENTS

JP    2014224304 A  * 12/2014

OTHER PUBLICATIONS

Cho et al. (JP 2014-224304 A); Dec. 4, 2014 (EPO machine translation to English). (Year: 2014).*

* cited by examiner

*Primary Examiner* — Maria V Ewald
*Assistant Examiner* — Donald M Flores, Jr.
(74) *Attorney, Agent, or Firm* — Oblon, McClelland, Maier & Neustadt, L.L.P.

(57) ABSTRACT

A wiring substrate includes a first insulating layer, a first conductor layer formed on the first insulating layer, a second insulating layer formed on the first conductor layer, a second conductor layer formed on the second insulating layer, and a via conductor formed in the second insulating layer such that the via conductor is connecting the first and second conductor layers. The second insulating layer has a via hole in which the via conductor is formed, and the via conductor includes a first plating film and a second plating film such that the first plating film has a bottom portion formed at bottom of the via hole and a side portion formed on side of the via hole and separated from the bottom portion by gap and that the second plating film is covering the gap of the first plating film and at least part of the first plating film.

20 Claims, 5 Drawing Sheets

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2022-017534, filed Feb. 7, 2022, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2014-224304 describes a copper plating solution composition for copper plating for a printed substrate. The entire contents of this publication are incorporated herein by reference.

SUMMARY OF THE INVENTION

According to one aspect of the present invention, a wiring substrate includes a first insulating layer, a first conductor layer formed on the first insulating layer, a second insulating layer formed on the first conductor layer, a second conductor layer formed on the second insulating layer, and a via conductor formed in the second insulating layer such that the via conductor is connecting the first conductor layer and the second conductor layer. The second insulating layer has a via hole in which the via conductor is formed, and the via conductor includes a first plating film and a second plating film formed on the first plating film such that the first plating film has a bottom portion formed at a bottom of the via hole and a side portion formed on a side of the via hole and separated from the side portion by a gap and that the second plating film is covering the gap of the first plating film and at least a part of the first plating film.

According to another aspect of the present invention, a method for manufacturing a wiring substrate includes forming a first conductor layer on a first insulating layer, forming a second insulating layer on the first insulating layer such that the second insulating layer covers the first conductor layer and has a via hole exposing a part of the first conductor layer, forming a via conductor in the via hole formed in the second insulating layer, and forming a second conductor layer on the second insulating layer such that the second conductor layer is connected to the first conductor layer formed on the first insulating layer via the via conductor. The forming of the via conductor includes forming a first plating film having a bottom portion at a bottom of the via hole and a side portion formed on a side of the via hole under a first plating condition such that the side portion is separated from the bottom portion by a gap formed between the bottom portion and the side portion, and forming a second plating film on the first plating film such that the second plating film fills the gap formed between the bottom portion and the side portion and covers at least a part of the first plating film under a second plating condition different from the first plating condition.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
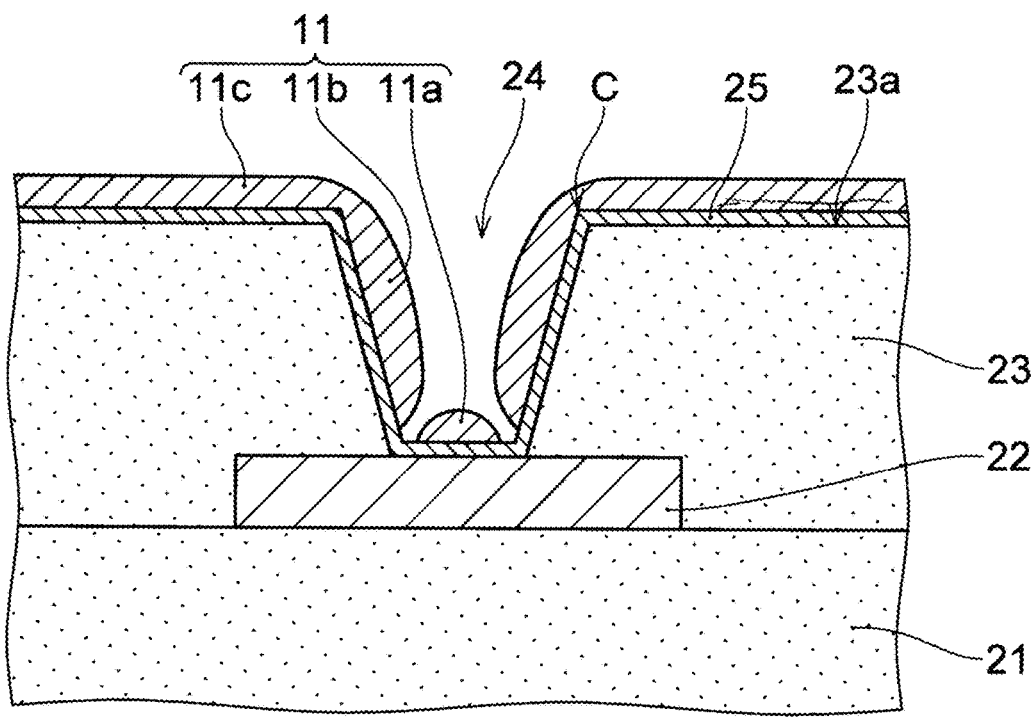
FIG. 1A is a cross-sectional view of a process in which a first plating film according to an embodiment of the present invention is formed.

Embodiments will now be described with reference to the accompanying drawings, wherein like reference numerals designate corresponding or identical elements throughout the various drawings.

FIG. 1A illustrates a cross-sectional view of a process in which a first plating film is formed in the method for manufacturing the wiring substrate of the embodiment. As illustrated in FIG. 1A, as a part of a build-up layer, a first conductor layer 22 is formed on one side of a first insulating layer 21, and a second insulating layer 23 is formed so as to cover the first conductor layer 22. Then, a via hole 24 is formed in the second insulating layer 23 so as to expose a part of the first conductor layer 22. A seed layer 25 for feeding a plating current is formed on an inner surface of the via hole 24 and on a first surface (23a) of the second insulating layer 23 on an opposite side with respect to the first insulating layer 21. By electrolytic plating in this state, a via conductor 13 (see FIG. 1D), which includes a first plating film 11 and a second plating film 12, is formed inside the via hole 24, and a second conductor layer 14 (see FIG. 1D) is formed on the first surface (23a) of the second insulating layer 23.

First, as illustrated in FIG. 1A, the first plating film 11 (11a, 11b, 11c) is formed by electrolytic plating with a low current density, which is a first plating condition, on a bottom surface of the via hole 24 formed in the second insulating layer 23, that is, on a surface of the first conductor layer 22 exposed by the via hole 24, on a side wall of the via hole 24, and on the first surface (23*a*) of the second insulating layer 23. In electrolytic plating with a low current density, less plating metal is deposited, and thus, the plating film is does not become too thick. Therefore, the first plating films (11*a*, 11*b*) formed in the via hole 24 are formed thin but substantially uniform except for corner parts. However, at a corner part, which is a boundary part between the bottom surface and the side surface of the via hole 24, deposition of a plating metal is unlikely to occur. Therefore, when a plating time is not long, at the corner part, which is the boundary part between the bottom surface and the side surface of the via hole, the first plating film 11 does not grow, and a recessed gap part is formed between the first plating film (11*a*) formed on the bottom surface and the first plating film (11*b*) formed on the side surface. In this case, also on the first surface (23*a*) of the second insulating layer 23, the first plating film (11*c*) is formed thin.

Figure 1B:
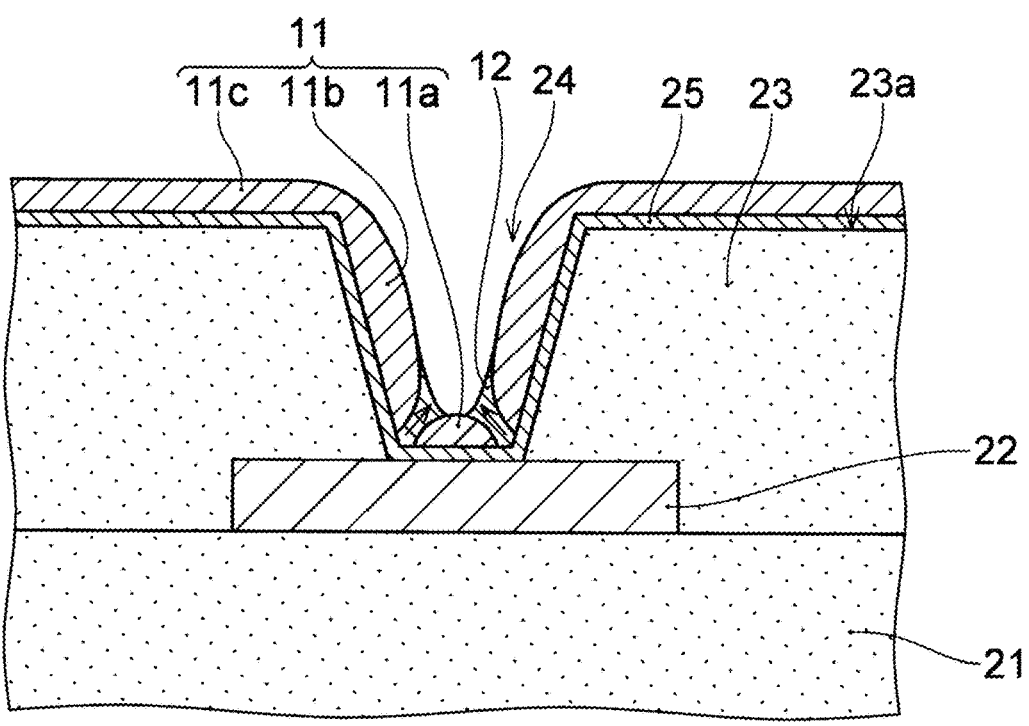
FIG. 1B is a cross-sectional view of a process in which a second plating film of according to an embodiment of the present invention is formed.
Figure 1C:
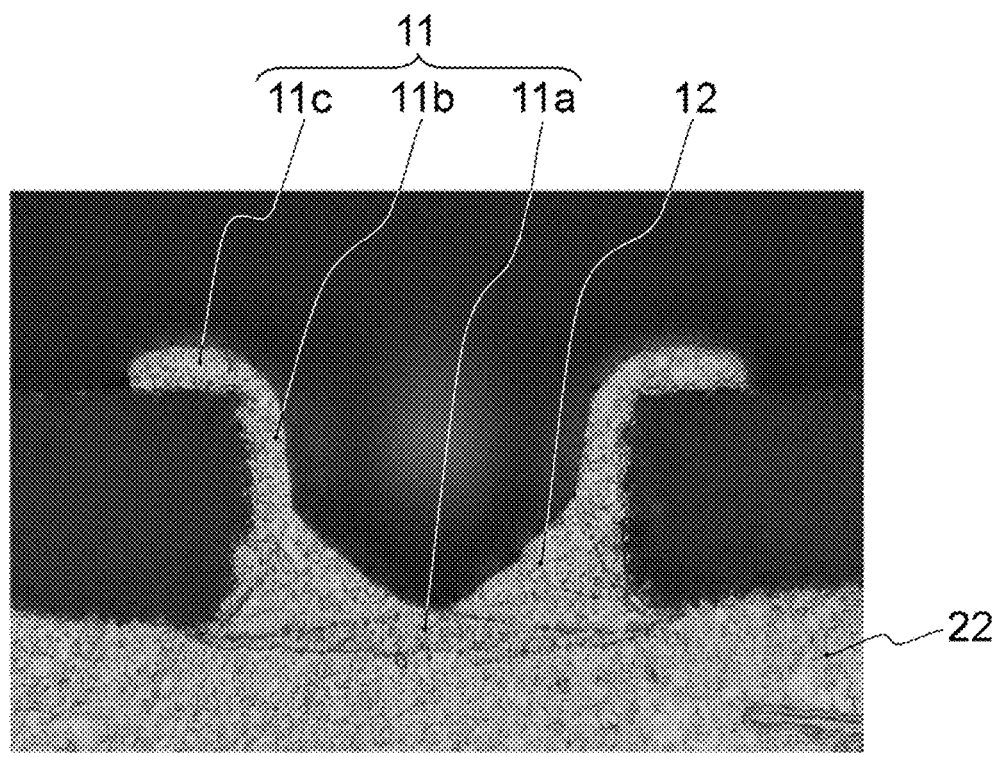
FIG. 1C shows an actual SEM photograph of a state of FIG. 1B.

As will be described later, an electrolytic plating solution contains additives such as an inhibitor that inhibits plating growth and an accelerator that promotes plating growth. Due to effects of these additives, which will be described later, the first plating films (11*a*, 11*b*) are formed on the bottom surface and the side surface, which form an inner surface of the via hole 24, without concentration of a plating film at a corner part (C) of an opening part of the via hole 24 and without deposition of a thick plating metal in a flat part on the second insulating layer 23. In FIGS. 1A-1C, the first plating film (11*b*) on the side surface of the via hole 24 and the first plating film (11*c*) on the second insulating layer 23 are continuously formed with the same thickness. However, due to the effect of the inhibitor or the like described above, the first plating film (11*c*) deposited on the first surface (23*a*) of the second insulating layer 23 may be thinner than the first plating film (11*b*) on the side surface of the via hole 24.

Specifically, the first plating film 11 is formed by electrolytic plating under the first plating condition. The first plating condition is, for example, a low current density of about 0.5 A/dm$^2$ or more and 3 A/dm$^2$ or less. When the current density is low, as described above, an amount of a plating metal deposited is small, and a thin first plating film 11 can be formed. Therefore, by shortening a plating time, in a state in which a plating metal is not deposited on the corner part of the bottom surface of the via hole 24, a recessed gap part (recess) can be formed between the first plating films (11*a*, 11*b*). Electrolytic plating under the first plating condition deposits less plating metal. However, since the first plating film 11 is thin, the plating time is not so long. In this case, deposition of a plating metal is remarkable at a center part of the bottom surface of the via hole 24, and as illustrated in FIG. 1A, a central portion of the first plating film (11*a*) on the bottom surface has a raised shape. Further, a current tends to concentrate at the corner part (C) of the opening part of the via hole 24. However, plating growth on the corner part (C) and on the first surface (23*a*) of the insulating layer 23 is suppressed by the effect of the inhibitor described above.

In other words, electrolytic plating under the first plating condition is completed such that the first plating film (11*a*) on the bottom surface of the via hole 24 and the first plating film (11*b*) on the side surface of the via hole 24 are not connected to each other and the recessed gap part is formed therebetween where the inner surface of the via hole 24 (the seed layer 25) is not covered. As a result, the first plating film (11*b*) formed on the side surface of the via hole 24 and the first plating film (11*c*) formed on the first surface (23*a*) of the second insulating layer 23 can be continuously formed. In other words, the first plating films (11*a*, 11*b*) are formed such that the first plating film (11*a*) on the bottom surface and the first plating film (11*b*) on the side surface are not too far apart from and not too close to each other and the recess is formed therebetween. However, the first plating film (11*b*) on the side surface and the first plating film (11*c*) on the first surface (23*a*) of the second insulating layer 23 can be continuously formed. For example, when the via hole 24 has a diameter of about 50 μm and a depth of about 30 μm, and the current density is 1 A/dm$^2$, it is preferably about 1 minute or more and 5 minutes or less. The via hole 24 can be formed to have an aspect ratio of about 0.25 or more and 0.90 or less.

The second plating film 12 is formed in the gap part between the first plating films (11*a*, 11*b*), which are separately formed on the bottom surface and the side surface in the via hole 24, to cover the inner surface of the via hole 24 that is not covered by the first plating film 11 (to cover the exposed seed layer 25) and to cover at least a part of a surface of the first plating film 11 facing a center part of the via hole 24. Specifically, as illustrated in the cross-sectional view of FIG. 1B and shown in the actual scanning electron microscope (SEM) photograph of FIG. 1C, under a second plating condition of a high current density, at the corner part of the bottom surface of the via hole 24, which is the recessed gap part between the first plating film (11*a*) formed on the bottom surface of the via hole 24 and the first plating film (11*b*) formed on the side surface of the via hole 24, a plating film preferentially grows on the seed layer 25 where the first plating film 11 is not formed, and the second plating film 12 filling the via hole 24 is formed.

The second plating condition is, for example, a current condition of a high current density of about 4 A/dm$^2$ or more and 15 A/dm$^2$ or less. When electrolytic plating is performed under such a high current density condition, more plating metal is deposited and a thick plating film can be obtained in a short time. On the other hand, the above-described recess formed between the first plating film (11*a*) on the bottom surface of the via hole 24 and the first plating film (11*b*) on the side surface of the via hole 24 has a very narrow width, and is a relatively narrower space than surfaces of the first plating films (11*a*, 11*b*). Therefore, for example, adsorption of an inhibitor added to an electrolytic plating solution is very low, and deposition of a plating metal by electrolytic plating becomes relatively more pronounced than on the surface of the first plating film 11. Therefore, the second plating film 12 is preferentially formed on the exposed portion of the seed layer 25 at the corner part of the bottom surface of the via hole 24. Therefore, in the electrolytic plating under the second plating condition, most of growth occurs from the corner part of the bottom surface of the via holes 24 where the first plating films (11*a*, 11*b*) are not formed. However, the second plating film 12 also grows on the surface of the first plating film 11.

On the other hand, on the first surface (23*a*) of the second insulating layer 23 outside the via hole 24 and on the seed layer 25 at the corner part (C), the growth of the second plating film 12 is further suppressed by an effect of an inhibitor or the like compared to that inside the via hole 24. Therefore, by effects of additives such as an added inhibitor, the growth of the second plating film 12 progresses the most in the recessed portion between the first plating films (11*a*, 11*b*) at the corner part of the bottom surface of the via hole 24, the growth of the second plating film 12 progresses next on the surface of the first plating film in the via hole 24, and the growth of the second plating film 12 is the least on the first surface (23a) of the second insulating layer 23. As a result, the second plating film 12 can grow from the bottom surface side of the via hole 24 without forming a void inside the via hole 24, and an upper surface of the via conductor 13 formed in the via hole 24 and a surface of the second conductor layer 14 (see FIG. 1D) on the second insulating layer 23 can be made substantially flush with each other.

In other words, the first plating film 11 is formed, and the second plating film 12 is formed thereon under the second plating condition of a high current density. Therefore, as illustrated in the schematic cross-sectional view of FIG. 1D and shown in the actual scanning electron microscope (SEM) photograph of FIG. 1E, the via conductor 13 including the seed layer 25, the first plating films (11a, 11b) and the second plating film 12 is formed in the via hole 24. Further, on the first surface (23a) of the second insulating layer 23, the second conductor layer 14 including a metal layer formed of the seed layer 25, the first plating film (11c) and the second plating film 12 is formed. The second conductor layer 14 can be formed, for example, using a semi-additive method or the like so as to include various conductor patterns such as desired wiring patterns, connection pads, and electrode pads.

Figure 1D:
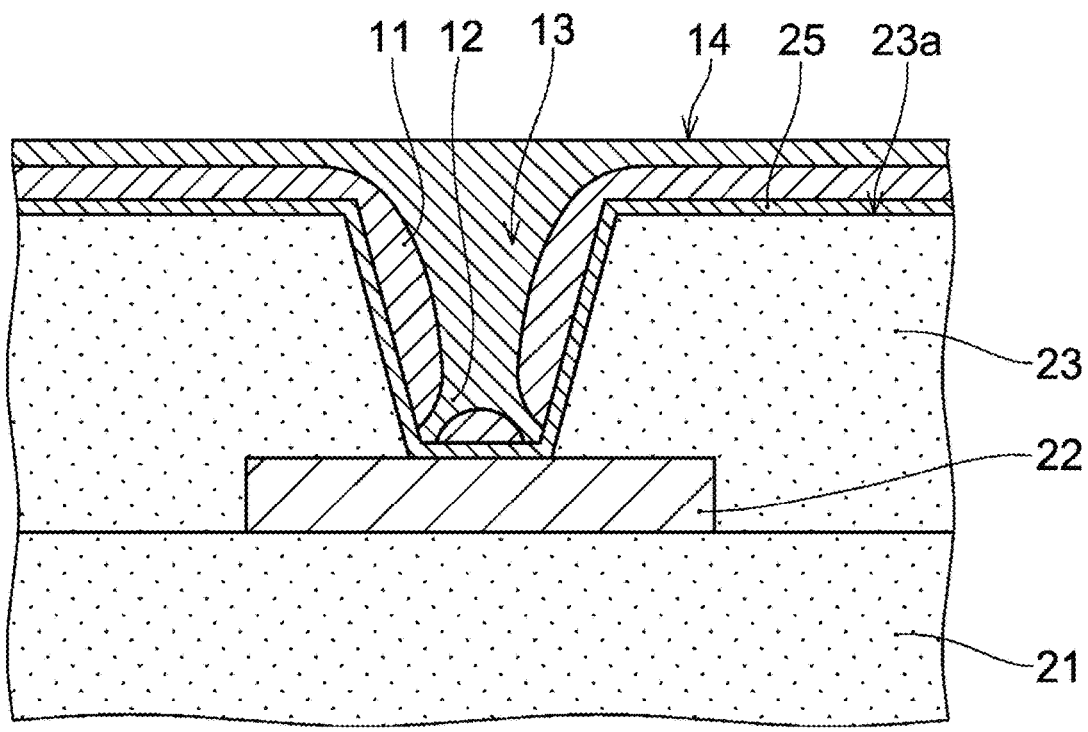
FIG. 1D is a schematic cross-sectional view of a state in which a via hole according to an embodiment of the present invention is completely filled.
Figure 1E:
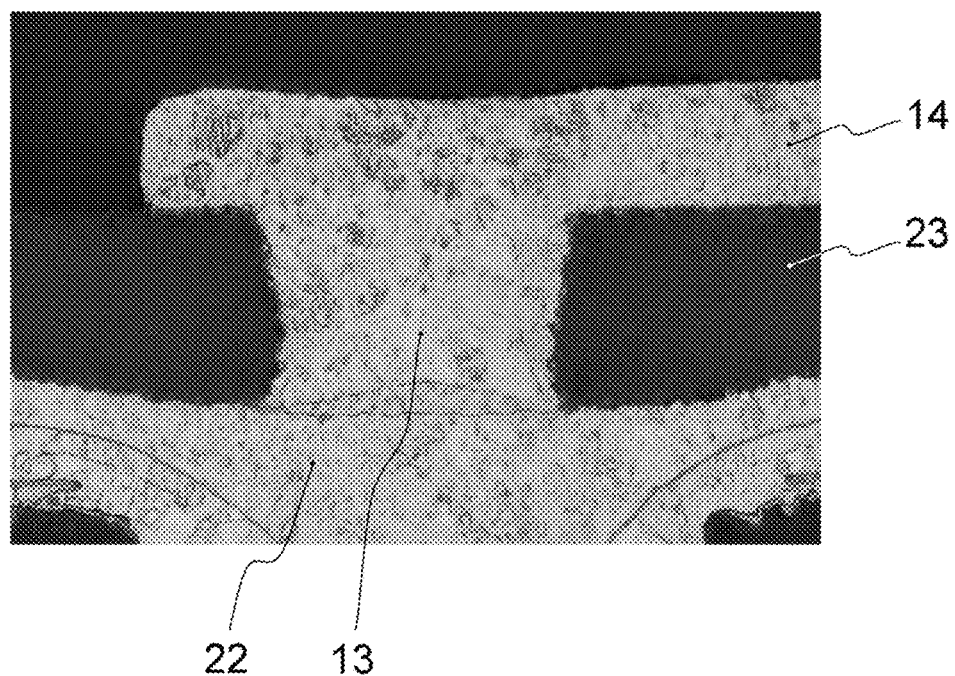
FIG. 1E shows an actual SEM photograph of a state of FIG. 1D.

In the example illustrated in FIG. 1D, after the second plating film 12 (in the state of FIG. 1B) filling the gap part between the first plating film (11a) on the bottom surface of the via hole 24 and the first plating film (11b) on the side surface of the via hole 24 is formed, the via conductor 13 and the second conductor layer 14 are formed by continuing plating under the second plating condition. However, after the state of FIG. 1, electrolytic plating under the first plating conditions, that is, with a low current density, may be continued, or the remaining space in the via hole 24 may be filled under another plating condition such as with an even higher current density than the second plating condition.

Further, by adding an inhibitor that inhibits plating growth and an accelerator that promotes growth in a plating solution at an optimal ratio, growth of a plating film on the first surface (23a) of the second insulating layer 23 is suppressed, and thereby, in the present embodiment, growth in the via hole 24 is promoted, and, as illustrated in FIG. 1D, the surface of the via conductor 13 and the surface of the second conductor layer 14 can be formed substantially flush with each other.

The seed layer 25 for feeding a plating current is formed on an underside of the first plating film 11. The seed layer 25 may be formed by electroless plating (chemical plating) using a chemical plating solution containing metal ions (often complexes) and a reducing agent, or using a physical vapor deposition method such as sputtering or vacuum deposition, or a chemical vapor deposition method such as CVD, or the like.

In the wiring substrate of the present embodiment, the via conductor 13 and the second conductor layer 14 are formed by the seed layer (metal layer) 25, the first plating film 11 and the second plating film 12. The first plating film 11 is not connected between the bottom surface and the side surface of the via hole 24 and the recessed gap part is formed therebetween. Therefore, the seed layer 25 is exposed between the first plating film (11a) formed on the bottom surface and the first plating film (11b) formed on the side surface, and the second plating film 12 is formed thereon so as to fill the gap part. Since the second plating film 12 can also cover the first plating films (11a, 11b) formed on the bottom surface and the side surface of the via hole 24, the second plating film 12 fills the via hole 24 from a bottom part of the via hole 24. Therefore, formation of a void, a dimple, or the like in the via hole 24 is suppressed. That is, a wiring substrate including a via conductor 13 having low resistivity and high reliability is obtained in a short time.

As a plating solution that forms the via conductor 13 and the second conductor layer 14 of the wiring substrate of the present embodiment, a copper plating solution is used, which is obtained by adding additives such as an inhibitor that suppresses plating growth and an accelerator that promotes plating growth to an aqueous solution containing a copper salt and an acid. As the copper salt, copper sulfate ($CuSO_4 \cdot 5H_2O$) is used. However, without being limited to copper sulfate, copper nitrate ($Cu(NO_3)_2$), copper formate ($Cu(HCOO)_2$), cupric chloride ($CuCl_2 \cdot 2H_2O$), and the like may also be used.

As the acid, sulfuric acid ($H_2SO_4 \cdot 5H_2O$) may be used. However, without being limited to sulfuric acid, hydrochloric acid (HCl), acetic acid ($CH_3COOH$), fluoroboric acid ($HBF_4$), and the like may also be used.

The inhibitor is formed of, for example, a polymeric organic substance, and has a large molecular weight and a low mobility, and thus, according to a law of mass diffusion, is more likely to be adsorbed on a flat part of a substrate surface and is less likely to be adsorbed in a narrow region such as in the via hole 24. Therefore, in the structure illustrated in FIG. 1A, the inhibitor is likely to be adsorbed in a flat surface on the first surface (23a) of the second insulating layer 23. Therefore, although deposition of plating is performed in the via hole 24, deposition of a plating metal in the flat surface on the first surface (23a) of the second insulating layer 23 is suppressed. By the same reasoning, in the above-described recessed gap part formed by the first plating films (11a, 11b) in the via hole 24, although a certain amount of the inhibitor enters into the via hole 24, the inhibitor having a large molecular weight hardly enters into the gap part between the first plating films (11a, 11b), and thus, deposition of a plating metal is promoted more than on the surfaces of the first plating films (11a, 11b). As a result, as illustrated in FIGS. 1A-1C, while the via conductor 13 filling the via hole 24 without creating a void therein and the second conductor layer 14 including wirings and the like formed on the first surface (23a) of the second insulating layer 23 can be formed at the same time by electrolytic plating, the surface of the via conductor 13 and the surface of the second conductor layer 14 can be easily made substantially flush with each other. The inhibitor is also likely to adhere to the corner part (C) of the opening part of the via hole 24 in addition to the flat surface on the first surface (23a) of the second insulating layer 23. Therefore, by adding the inhibitor, local growth of a plating film at the corner part (C) can also be suppressed.

The accelerator is formed of chloride ions (Cl), hydrochloric acid (HCl), sodium chloride (NaCl), or the like, and acts to promote deposition of plating. The accelerator is substantially evenly adsorbed on the bottom surface and the side surface of the via hole 24 and in the flat surface part on the second insulating layer 23. As plating progresses, the accelerator becomes denser in the via hole 24 as plating metal grows. Therefore, a plating rate in the via hole 24 is faster than that in the flat surface part on the second insulating layer 23. On the other hand, by also adding the above-described inhibitor, growth of a plated metal in the flat part is suppressed. That is, by adding the accelerator and the inhibitor at an appropriate ratio, the surface of the thick via conductor 13 and the surface of the thin second conductor layer 14 are made uniform.

The inhibitor and the accelerator may be mixed at an appropriate ratio in one plating solution, and, by the effects of both, the via hole 24 is filled with copper. This is because a deposition characteristic of a plating metal varies depending on the diameter and the depth of the via hole 24.

Additives are not limited to the above-described inhibitor and accelerator, and a leveling agent that is easy to be adsorbed on the flat surface and is difficult to be adsorbed in the via hole 24, a brightening agent that is adsorbed to growth points of crystal nuclei to suppress crystal growth, a reducing agent, and the like may be added.

By adding the above-described inhibitor, deposition of crystals can be suppressed at the corner part (C) in the opening part of the via hole 24 and on the first surface (23a) of the second insulating layer 23. On the other hand, in the via hole 24, further, since the inhibitor is unlikely to be adsorbed in the recess (the gap part) formed in the via hole 24, copper, which is the plating metal on the bottom surface and the side surface of the via hole 24, is deposited. However, when it is uniform in the via hole 24, deposition of a plating metal in the corner part of the bottom surface of the via hole 24 is relatively difficult. As a result, by controlling an electrolytic plating time to a short time under the first plating condition, as illustrated in FIG. 1A, the first plating film (11a) and the first plating film (11b) are respectively formed on the bottom surface and the side surface of the via hole 24 such that they are not connected to each other. The first plating film (11a) formed on the bottom surface and the first plating film (11b) formed on the side surface are separated from each other, and the seed layer 25 in the via hole 24 is exposed in the gap part.

The current density of the second plating condition is higher than the current density of the first plating condition. Specifically, it is preferably 4 A/dm$^2$ or more and 15 A/dm$^2$ or less. In other words, it is preferably about 1.2 or more and 30 or less times the current density of the first plating condition. As a result, the second plating film 12 is formed in a short time under the second plating condition. In addition, as illustrated in FIG. 1B, in a bottom surface part of the via hole 24, as described above, since the gap part between the first plating films (11a, 11b) has a concave shape, the second plating film 12 is preferentially formed from the gap part. As a result, without formation of a void or the like, as illustrated in FIG. 1D, the via conductor 13 is formed in the via hole 24 in a short time, and the second conductor layer 14 is formed on the first surface (23a) of the second insulating layer 23.

In the following, a method for manufacturing the wiring substrate of the embodiment is described with reference to FIGS. 2A-2F. FIGS. 2A-2F illustrate only a part that forms a via conductor when a build-up wiring substrate is manufactured.

Figure 2A:
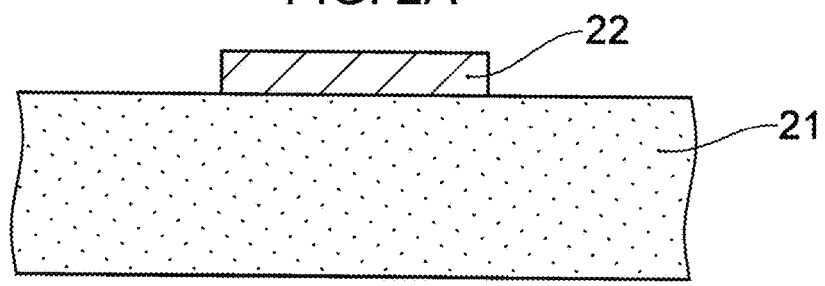
FIG. 2A is a cross-sectional view illustrating an example of a method for manufacturing a wiring substrate according to an embodiment of the present invention.

As illustrated in FIG. 2A, the first conductor layer 22 including a wiring pattern is formed on the first insulating layer 21. The first insulating layer 21 is formed of any insulating resin. Examples of the insulating resin include an epoxy resin, a bismaleimide triazine resin (BT resin), a phenol resin, and the like. Although not explicitly illustrated in the example of FIG. 2A, the first insulating layer 21 may contain a core material (reinforcing material) formed of a glass fiber, an aramid fiber, or the like. Although not illustrated in FIG. 2A, a core material such as a glass fiber may be contained. The first insulating layer 21 may further contain an inorganic filler (not illustrated in the drawings) formed of fine particles of silica ($SiO_2$), alumina, mullite, or the like.

The first conductor layer 22 may have a desired conductor pattern by patterning a metal foil laminated on the first insulating layer 21 using a subtractive method, or may be formed using a semi-additive method similar to the second conductor layer 14 to be described later. The metal is not particularly limited, and any metal such as copper or nickel may be used.

Figure 2B:
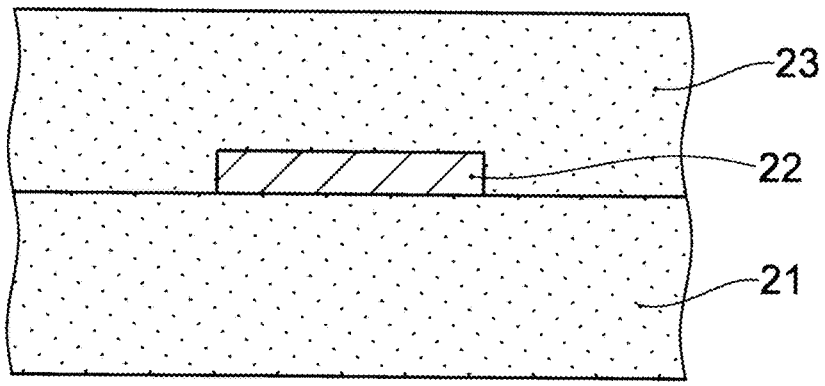
FIG. 2B is a cross-sectional view illustrating an example of a method for manufacturing a wiring substrate according to an embodiment of the present invention.

As illustrated in FIG. 2B, the second insulating layer 23 is formed on the first insulating layer 21 so as to cover the first conductor layer 22. Specifically, for example, a film-like epoxy resin is laminated on the first insulating layer 21 on which the first conductor layer 22 is formed, and heat and pressure are applied thereto. As a result, the second insulating layer 23 is formed.

Figure 2C:
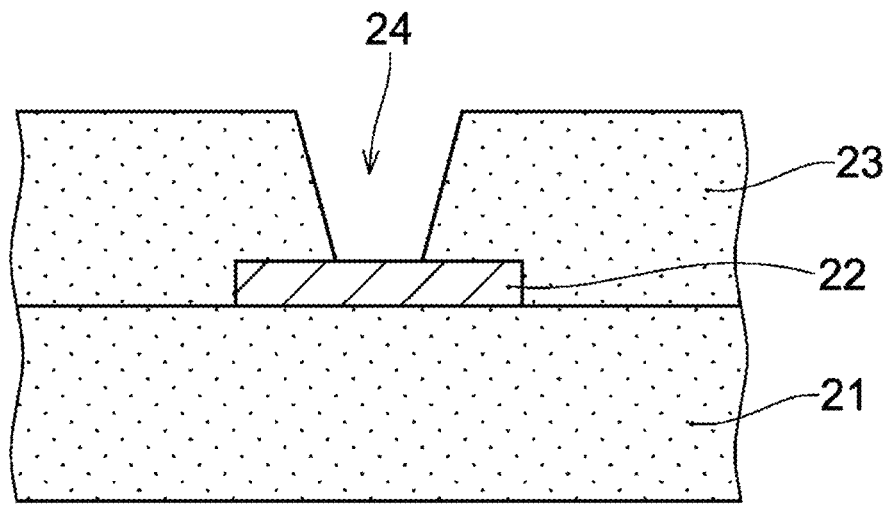
FIG. 2C is a cross-sectional view illustrating an example of a method for manufacturing a wiring substrate according to an embodiment of the present invention.

As illustrated in FIG. 2C, the via hole 24 is formed in the second insulating layer 23 such that a part of the first conductor layer 22 is exposed. Specifically, the via hole 24 for forming the via conductor 13 in the second insulating layer 23 for connecting lower-layer and upper-layer conductor layers of the second insulating layer 23 is formed, for example, by irradiation of $CO_2$ laser. Since $CO_2$ laser becomes weaker as it propagates deeper into the second insulating layer 23, as illustrated in FIG. 2C, the via hole 24 has a tapered cross-sectional shape and has a shape that is thinner at the bottom surface part than at the opening part. A surface of the first conductor layer 22 exposed by the formation of the via hole 24 becomes the bottom surface of the via hole 24.

Figure 2D:
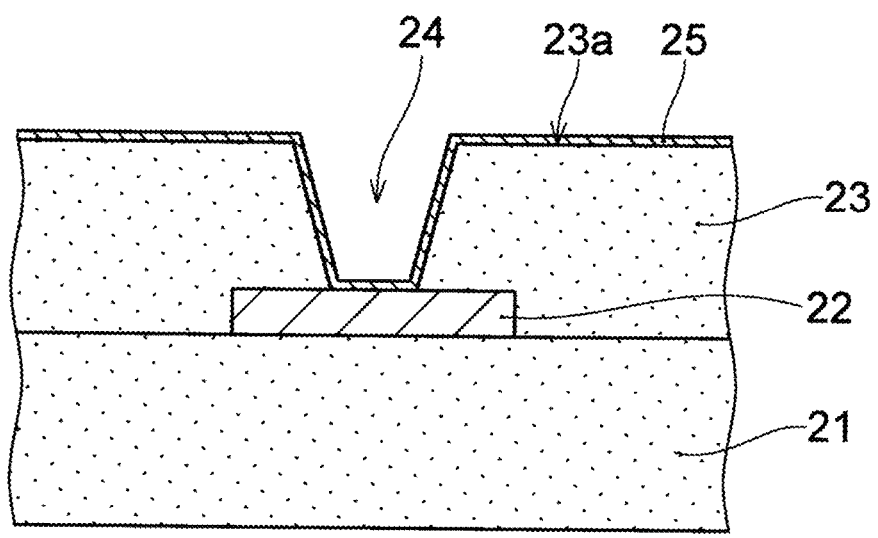
FIG. 2D is a cross-sectional view illustrating an example of a method for manufacturing a wiring substrate according to an embodiment of the present invention.

As illustrated in FIG. 2D, the seed layer 25 for feeding a plating current is formed on the inner surface of the via hole 24 including the bottom surface and the side surface and on the first surface (23a) of the second insulating layer 23, which is on an opposite side with respect the first insulating layer 21. The seed layer 25 is formed, for example, by chemical plating such as electroless plating, or physical vapor deposition such as sputtering and vacuum deposition or chemical vapor deposition such as CVD. The first surface (23a) of the second insulating layer 23 and the side surface of the via hole 24 are surfaces of an insulating layer, and thus, cannot conduct electricity for electrolytic plating. Therefore, a metal film for power feeding is formed on substantially the entire surface. This seed layer 25 is formed as a thin layer that does not cause any discontinuity as long as it allows a current to flow.

Figure 2E:
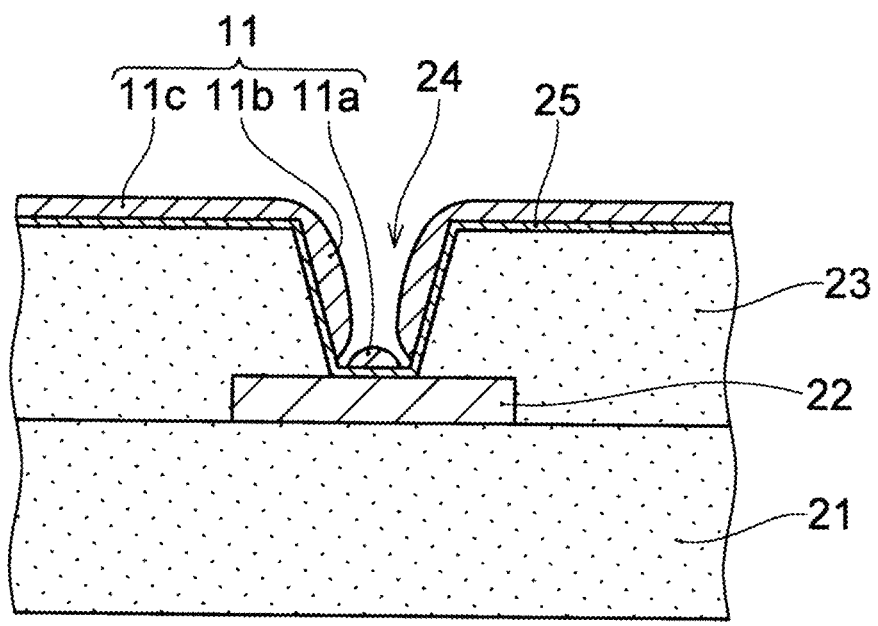
FIG. 2E is a cross-sectional view illustrating an example of a method for manufacturing a wiring substrate according to an embodiment of the present invention.

After that, as illustrated in FIG. 2E, the first plating film 11 is formed under the first plating condition on the bottom surface and the side surface of the via hole 24 so as to have the recessed gap part between the portion (11a) on the bottom surface and the portion (11b) on the side surface. That is, the first plating film 11 (11a, 11b) is formed such that the portion (11a) on the bottom surface and the portion (11b) on the side surface are not connected to each other and the recess is formed therebetween, and such that a part of the seed layer 25 on the bottom surface side of the via hole 24 is not covered. In other words, the first plating films (11a, 11b) are formed such that the gap part is neither too large nor too small. Therefore, the first plating film 11 is formed thin, and is formed without a risk that a first plating film (11b) deposited on a part of the side surface of the via hole 24 may contact a first plating film (11b) deposited on an opposing part of the side surface. As described above, when a first plating film (11b) deposited on a part of the side surface is in contact with a first plating film (11b) deposited on an opposing part of the side surface, a void is likely to form on the bottom surface side of that portion. However, it is thought that such a risk does not occur. further, when the first plating film (11a) deposited on the bottom surface of the via hole 24 and the first plating film (11b) formed on the side surface of the via hole 24 are in contact with each other so that the inner surface of the via hole 24 is entirely covered by the first plating film 11, there is a risk that the following plating growth under the second plating condition may not be sufficient on the bottom surface side. However, it is thought that such a possibility also does not occur.

On the seed layer 25 on the first surface (23*a*) of the second insulating layer 23, for example, by adding the above-described inhibitor to an electrolytic plating solution, the inhibitor is adsorbed more than in the via hole 24 according to the diffusion law, and thus, deposition of a plating metal is suppressed and a plating film is not deposited as much as that in the via hole 24 so that the first plating film (11*c*) is formed as a thin layer. The thickness of the first plating film (11*c*) may be adjusted by adjusting a mixing ratio of an inhibitor, an accelerator, and the like to be added.

Figure 2F:
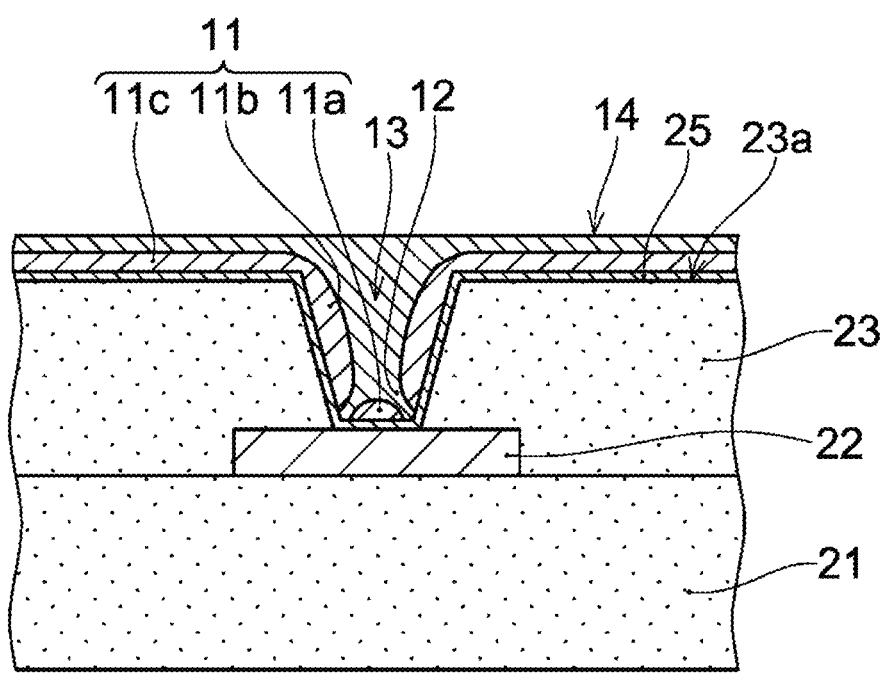
FIG. 2F is a cross-sectional view illustrating an example of a method for manufacturing a wiring substrate according to an embodiment of the present invention.

Next, as illustrated in FIG. 2F, under the second plating condition, deposition of a plating metal (copper) begins from a portion of the seed layer 25 that is not covered by the first plating film 11 between the first plating films (11*a*, 11*b*) formed on the bottom surface and the side surface of the via hole 24. As described above, an inhibitor added to an electrolytic plating solution is difficult to be adsorbed in a narrow region such as a recess, but is relatively easy to be adsorbed in a flat part. Therefore, deposition of a plating metal begins preferentially in the recessed gap part between the first plating films (11*a*, 11*b*) rather than the surface of the first plating film 11. On the other hand, although a plating metal grows on the surface of the first plating film 11, since plating growth on the bottom surface side of the via hole 24 is dominant, plating grows from the bottom surface side of the via hole 24, a void is unlikely to be formed, and the second plating film 12 is formed in the via hole 24 in a short time.

The current density of the second plating condition is about 1.2 or more and 30 or less times the current density of the first plating condition. Specifically, the second plating film 12 is formed with a current of a current density of 4 $A/dm^2$ or more and 15 $A/dm^2$ or less. As described above, when electrolytic plating is performed under the second plating condition, a plating metal is deposited on the surface of the seed layer 25 appearing in the recessed gap part between the first plating film (11*a*) formed on the bottom surface of the via hole 24 and the first plating film (11*b*) formed on the side surface of the via hole 24, and a new plating metal is further deposited on the deposited plating metal, and thereby, plating growth is performed in a short time.

As described above, the growth rate of the second plating film 12 decreases in the order of the gap part between the first plating films (11*a*, 11*b*), the first plating film 11, and the first surface (23*a*) of the second insulating layer 23. However, it also grows on the first plating film 11, the growth of the plating metal progresses sequentially from the bottom surface side of the via hole 24, and the via conductor 13 is embedded in the via hole 24. In FIG. 2E, the first plating film (11*b*) on the side surface of the via hole 24 and the first plating film (11*c*) on the first surface (23*a*) of the second insulating layer 23 are continuously formed. However, the thickness of the first plating film 11 becomes thinner on the first surface (23*a*).

In the example illustrated in FIG. 2F, following the second plating film 12 formed at the bottom part of the via hole 24, the second plating film continues to grow under the second plating condition to form the via conductor 13. However, as described above, as illustrated in FIG. 1B, when the bottom part of the via hole 24 is filled with the second plating film 12, it is not always necessary to continue plating under the second plating condition, and the rest of the via hole 24 may be filled under other plating conditions.

According to the method for manufacturing the wiring substrate of the present embodiment, the first plating films (11*a*, 11*b*) are formed with a current of a low current density, which is the first plating condition, such that the recess is formed between the first plating films (11*a*, 11*b*), which are respectively formed on the bottom surface and the side surface of the via hole 24 without being connected to each other, and a part including the corner part of the bottom surface of the via hole 24 is not covered. After that, the second plating film 12 is formed with a current of a high current density, which is the second plating condition, at least near the bottom surface part of the via hole 24 from the gap part between the first plating films (11*a*, 11*b*) formed on the bottom surface and the side surface of the via hole 24. Therefore, since the second plating film 12 is formed from the bottom surface side of the via hole 24 and is formed by electrolytic plating with a high current density, it is thought that the via conductor 13 is formed in a short time without creating a void or a dimple in the via conductor 13.

In Japanese Patent Application Laid-Open Publication No. 2014-224304, sufficient metal may not be deposited in a via hole on a bottom surface side, and a void or a surface recess in a plating film is likely to occur. Further, an electrolytic plating time may become long.

A wiring substrate according to an embodiment of the present invention includes: a first insulating layer; a first conductor layer that is formed on the first insulating layer; a second insulating layer that is formed on the first insulating layer so as to cover the first conductor layer; a via hole that is formed in the second insulating layer so as to expose a part of the first conductor layer; a seed layer that is formed on an inner surface of the via hole and on a first surface of the second insulating layer, the first surface being on an opposite side with respect to a surface of the second insulating layer facing the first insulating layer; a via conductor that is formed in the via hole; and a second conductor layer that is connected to the via conductor and is formed on the first surface. The via conductor includes: a first plating film that is separately formed on a bottom surface and on a side surface of the via hole; and a second plating film that is formed so as to cover a gap part of the first plating film that is not covered by the first plating film due to the separation of the first plating film, and to cover at least a part of a surface of the first plating film facing an inner side of the via hole.

A method for manufacturing a wiring substrate according to another embodiment of the present invention includes: forming a first conductor layer including a wiring pattern on a first insulating layer; forming a second insulating layer on the first insulating layer so as to cover the first conductor layer; forming a via hole in the second insulating layer so as to expose a part of the first conductor layer; forming a via conductor in the via hole; and forming a second conductor layer on the second insulating layer. The forming of the via conductor includes: forming a first plating film on a bottom surface and a side surface of the via hole under a first plating condition so as to have a gap part between the portion on the bottom surface and the portion on the side surface; and forming a second plating film filling the via hole in the gap part and on the first plating film under a second plating condition different from the first plating condition.

A wiring substrate according to an embodiment of the present invention has a highly reliable via conductor, and a method for manufacturing a wiring substrate according to an embodiment of the present invention allows such a wiring substrate to be easily manufactured. In a wiring substrate and a method for manufacturing the wiring substrate according to embodiments of the present invention, a via conductor is formed by embedding a plating metal by electrolytic plating without creating a void or a dimple in a via hole formed in an insulating layer of a built-up wiring substrate.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a first insulating layer;
a first conductor layer formed on the first insulating layer;
a second insulating layer formed on the first conductor layer;
a second conductor layer formed on the second insulating layer; and
a via conductor formed in the second insulating layer such that the via conductor is connecting the first conductor layer and the second conductor layer,
wherein the second insulating layer has a via hole in which the via conductor is formed, and the via conductor includes a first plating film and a second plating film formed on the first plating film such that the first plating film has a bottom portion formed at a bottom of the via hole and a side portion formed on a side of the via hole and separated from the bottom portion by a gap and that the second plating film is covering the gap of the first plating film and at least a part of the first plating film.

2. The wiring substrate according to claim 1, wherein the first plating film comprises a first electrolytic plating film, and the second plating film comprises a second electrolytic plating film.

3. The wiring substrate according to claim 2, wherein each of the first plating film and the second plating film includes a main component comprising copper.

4. The wiring substrate according to claim 1, wherein the second conductor layer includes the first plating film extending from the side surface of the via hole.

5. The wiring substrate according to claim 4, wherein the first plating film formed at the bottom of the via hole has a raised central portion.

6. The wiring substrate according to claim 1, wherein the first plating film formed at the bottom of the via hole has a raised central portion.

7. The wiring substrate according to claim 1, wherein the second insulating layer is formed such that the via hole has an aspect ratio of 0.25 or more and 0.90 or less.

8. The wiring substrate according to claim 1, wherein the via conductor is formed such that the second plating film is filling a space formed by the first plating film in the via hole.

9. The wiring substrate according to claim 1, wherein the via conductor and second conductor layer includes a seed layer formed in the via hole and on the second insulating layer.

10. A method for manufacturing a wiring substrate, comprising:
forming a first conductor layer on a first insulating layer;
forming a second insulating layer on the first insulating layer such that the second insulating layer covers the first conductor layer and has a via hole exposing a part of the first conductor layer;
forming a via conductor in the via hole formed in the second insulating layer; and
forming a second conductor layer on the second insulating layer such that the second conductor layer is connected to the first conductor layer formed on the first insulating layer via the via conductor,
wherein the forming of the via conductor includes forming a first plating film having a bottom portion at a bottom of the via hole and a side portion formed on a side of the via hole under a first plating condition such that the side portion is separated from the bottom portion by a gap formed between the bottom portion and the side portion, and forming a second plating film on the first plating film such that the second plating film fills the gap formed between the bottom portion and the side portion and covers at least a part of the first plating film under a second plating condition different from the first plating condition.

11. The method for manufacturing a wiring substrate according to claim 10, wherein the forming of the first plating film includes applying first electrolytic plating, and the forming of the second plating film includes applying second electrolytic plating.

12. The method for manufacturing a wiring substrate according to claim 11, wherein the second plating condition in the forming of the second plating film includes a current density that is higher than a current density of the first plating condition in the forming of the first plating film.

13. The method for manufacturing a wiring substrate according to claim 12, wherein the current density of the second plating condition is in a range of 1.2 to 30 times the current density of the first plating condition.

14. The method for manufacturing a wiring substrate according to claim 11, wherein the first electrolytic plating includes applying a first direct current, and the second electrolytic plating includes applying a second direct current.

15. The method for manufacturing a wiring substrate according to claim 10, wherein the forming of the second plating film includes depositing the second plating film from a surface in the gap in the via hole that is not covered by the first plating film.

16. The method for manufacturing a wiring substrate according to claim 10, wherein the first plating condition in the forming of the first plating film include using a plating solution including a copper salt, and the second plating condition in the forming of the second plating film includes using a plating solution including a copper salt.

17. The method for manufacturing a wiring substrate according to claim 16, wherein the copper salt in the first plating condition is at least one selected from a group consisting of copper sulfate, copper nitrate, copper formate and cupric chloride, and the copper salt in the second plating condition is at least one selected from a group consisting of copper sulfate, copper nitrate, copper formate and cupric chloride.

18. The method for manufacturing a wiring substrate according to claim 16, wherein the first plating condition in the forming of the first plating film includes adding a plating accelerator that promotes plating growth to the plating solution including the copper salt of the first plating condition, and the second plating condition in the forming of the second plating film includes adding a plating accelerator that promotes plating growth to the plating solution including the copper salt of the second plating condition.

19. The method for manufacturing a wiring substrate according to claim 16, wherein the first plating condition in the forming of the first plating film includes adding a plating inhibitor that inhibits plating growth to the plating solution including the copper salt including the copper salt of the first plating condition, and the second plating condition in the forming of the second plating film includes adding a plating inhibitor that inhibits plating growth to the plating solution including the copper salt of the second plating condition.

20. The method for manufacturing a wiring substrate according to claim 10, further comprising:
   forming a seed layer on the side and bottom of the via hole and on a surface of the second insulating layer on an opposite side with respect to a surface of the second insulating layer facing the first insulating layer such that the seed layer is formed before the forming of the first plating film.

* * * * *